United States Patent
Sun et al.

(10) Patent No.: US 11,719,394 B2
(45) Date of Patent: Aug. 8, 2023

(54) LIGHTING DEVICE

(71) Applicants: Emily Sun, McLean, VA (US); Abigail Xu, Great Falls, VA (US)

(72) Inventors: Emily Sun, McLean, VA (US); Abigail Xu, Great Falls, VA (US)

(*) Notice: Subject to any disclaimer, the term of this patent is extended or adjusted under 35 U.S.C. 154(b) by 0 days.

(21) Appl. No.: 17/654,463

(22) Filed: Mar. 11, 2022

(65) Prior Publication Data

US 2022/0290824 A1 Sep. 15, 2022

Related U.S. Application Data

(60) Provisional application No. 63/160,379, filed on Mar. 12, 2021.

(51) Int. Cl.
| | |
|---|---|
| *F21L 4/08* | (2006.01) |
| *F21L 13/00* | (2006.01) |
| *H10N 10/17* | (2023.01) |
| *F21V 29/51* | (2015.01) |
| *F21V 29/56* | (2015.01) |
| *H10N 19/00* | (2023.01) |

(52) U.S. Cl.
CPC ............... *F21L 4/085* (2013.01); *F21L 13/00* (2013.01); *H10N 10/17* (2023.02); *F21L 4/08* (2013.01); *F21V 29/51* (2015.01); *F21V 29/56* (2015.01); *H10N 19/00* (2023.02)

(58) Field of Classification Search
CPC ............ F21L 4/085; F21L 13/00; H01L 35/32
See application file for complete search history.

(56) References Cited

U.S. PATENT DOCUMENTS

| | | | | |
|---|---|---|---|---|
| 2007/0236920 | A1* | 10/2007 | Snyder | F21V 29/70 362/157 |
| 2008/0273319 | A1* | 11/2008 | VanderSchuit | F21V 33/0028 362/101 |
| 2013/0033881 | A1* | 2/2013 | Terazawa | F21V 29/677 165/104.34 |
| 2016/0128141 | A1* | 5/2016 | Makosinski | F21L 13/00 315/294 |

FOREIGN PATENT DOCUMENTS

| | | | | |
|---|---|---|---|---|
| DE | 202013009160 U1 * | 2/2014 | | F21L 13/00 |
| KR | 20150116621 A * | 10/2015 | | F21L 13/00 |

* cited by examiner

*Primary Examiner* — Colin J Cattanach
(74) *Attorney, Agent, or Firm* — Hunton Andrews Kurth LLP

(57) ABSTRACT

A handheld lighting device comprises a cylindrical body forming an inner wall and an outer wall, and further having a distal end and a proximate end. The device comprises at least one peltier tile disposed along the outer wall and towards the proximate end of the cylindrical body, each of the at least one peltier tile having a first side for coming into contact with a user's hand and a second side which forms part of the inner wall of the cylindrical body. Also, at least one lighting element is disposed at least partially within and towards the distal end of the cylindrical body. The device includes a conversion component electrically connected to the at least one lighting element and the at least one peltier tile, and at least one cooling component is disposed within the cylindrical body and contacting the second side of the at least one peltier tile.

7 Claims, 2 Drawing Sheets

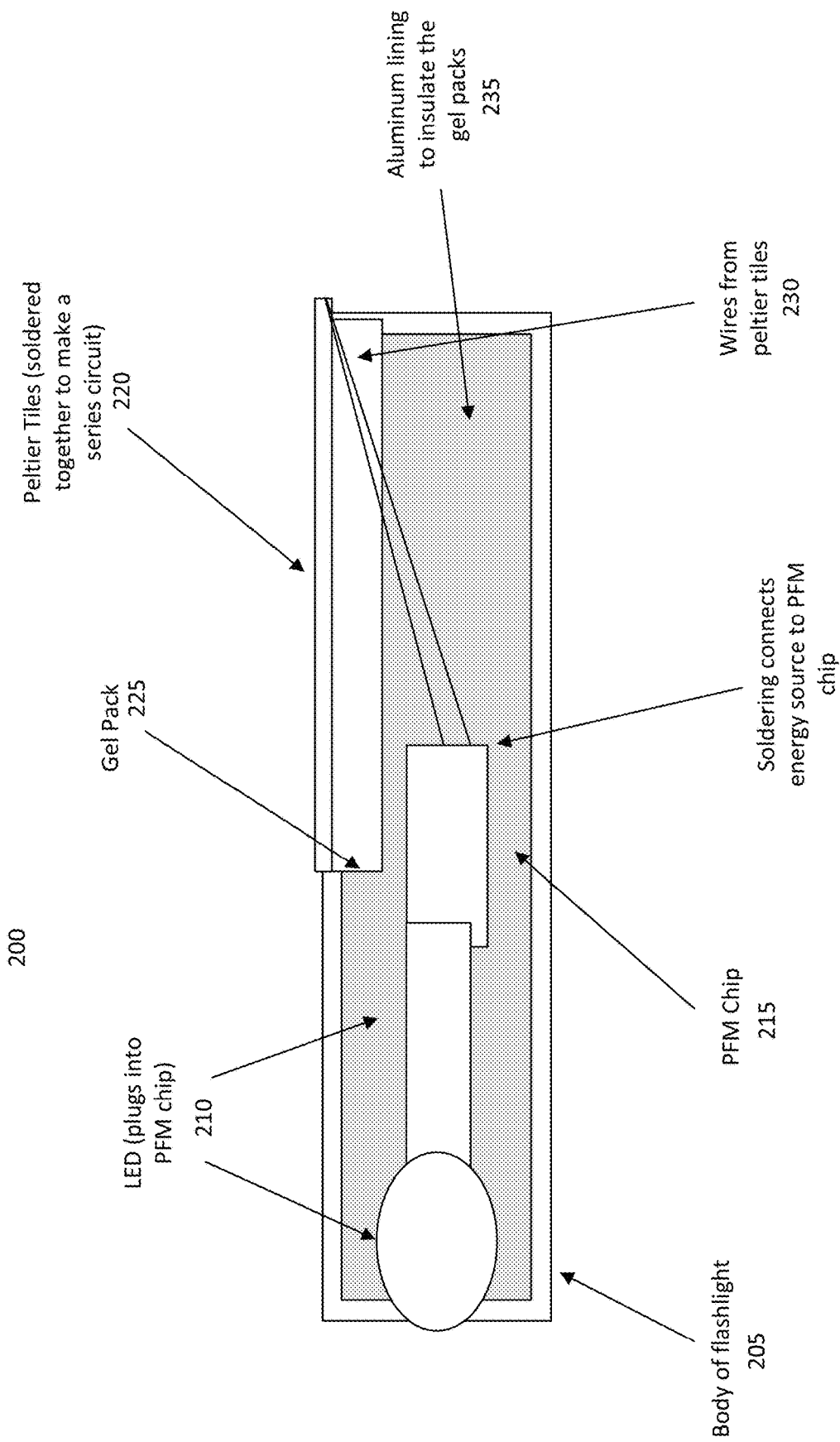

LIGHTING DEVICE

CROSS REFERENCE TO RELATED APPLICATIONS

This patent application claims priority to U.S. Provisional Application No. 63/160,379, filed Mar. 12, 2021, the complete disclosure of which is incorporated herein by reference.

FIELD OF THE INVENTION

This invention relates generally to an improved thermoelectric lighting device.

BACKGROUND OF THE INVENTION

Conventional battery-powered flashlights are expensive, temporary and harmful to the environment. In contrast, thermoelectric flashlights do not use traditional batteries, but are instead powered by body heat (specifically through the thermoelectric effect) and may be constructed using affordable and environmentally friendly materials. However, because thermoelectric flashlights are powered by the difference in temperature between the human hand and the air, they only operate within a specific set of temperature differentials and thus have a short span of operation.

These and other problems exist.

SUMMARY OF THE INVENTION

An object of the present invention is to overcome the aforementioned and other drawbacks existing in the prior art.

According to an embodiment, a handheld lighting device is provided. In some embodiments, the handheld lighting device comprises a cylindrical body forming an inner wall and an outer wall, and further having a distal end and a proximate end. The device also comprises at least one peltier tile disposed along the outer wall and towards the proximate end of the cylindrical body, each of the at least one peltier tile having a first side for coming into contact with a user's hand and a second side which forms part of the inner wall of the cylindrical body. Also, at least one lighting element is disposed at least partially within and towards the distal end of the cylindrical body. The device also includes a conversion component electrically connected to the at least one lighting element and the at least one peltier tile, and at least one cooling component is disposed within the cylindrical body and contacting the second side of the at least one peltier tile.

According to another embodiment, a handheld lighting device is provided. The handheld lighting device comprises a cylindrical body forming an inner wall and an outer wall, and further having a distal end and a proximate end. The device further comprises a plurality of peltier tiles electrically connected in serial and disposed along the outer wall and towards the proximate end of the cylindrical body, each of the plurality of peltier tiles having a first side for coming into contact with a user's hand and a second side which forms part of the inner wall of the cylindrical body. At least one lighting element is disposed at least partially within and towards the distal end of the cylindrical body. The device also includes an energy conversion component electrically connected to the at least one lighting element and the plurality of peltier tiles, and a rechargeable gel pack disposed within the cylindrical body and contacting and cooling the second sides of the plurality of peltiers tile. The device further includes an insulating lining or component disposed along the inner wall of the cylindrical body to insulate and reduce warming of the at least one cooling component during operation.

The accompanying drawings, which are incorporated in and constitute a part of this specification, illustrate various embodiments of the invention and, together with the description, serve to explain the principles of the invention.

BRIEF DESCRIPTION OF THE DRAWINGS

FIG. 2 is a cross-sectional side view of a lighting device 200, according to another embodiment of the present invention.

DETAILED DESCRIPTION OF THE INVENTION

Figure 1:
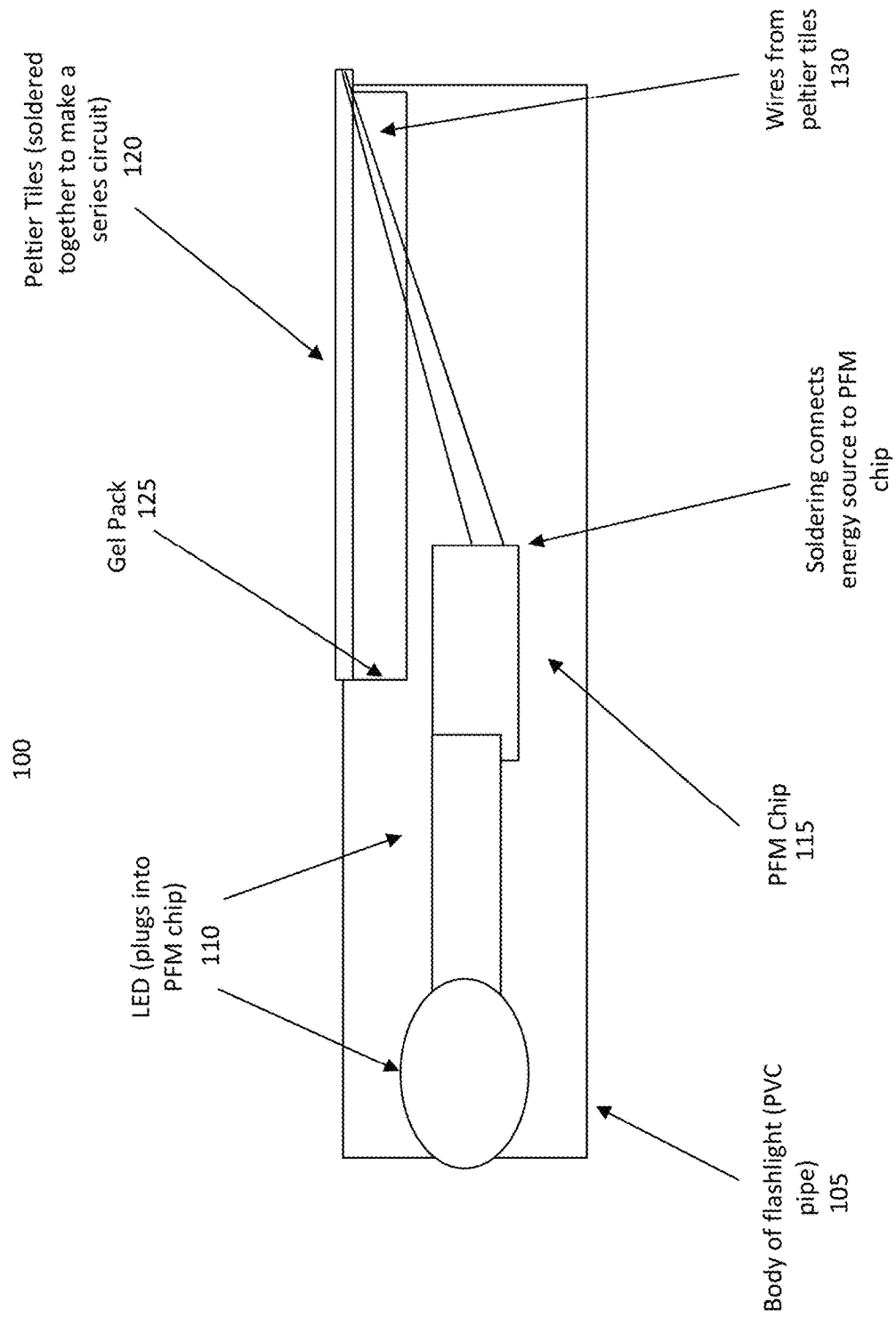
FIG. 1 is a cross-sectional side view of a lighting device 100, according to one embodiment of the invention.

Reference will now be made to the present preferred embodiments of the invention, examples of which are illustrated in the accompanying drawings in which like reference characters refer to corresponding elements.

FIG. 1 is a cross-sectional side view of a lighting device 100, according to one embodiment of the invention. As shown lighting device 100 may include a body 105 that in some embodiments may comprise a cylindrical shape. Other shapes are possible. Body 105 may be constructed from any solid or flexible material, including but not limited to polyethylene terephthalate (PET), polyvinyl chloride (PVC), polyurethane, or other plastic material.

The left (or distal) side of the lighting device 100 may include at least one lighting element 110 that in some embodiments may comprise at least one light-emitting diode, incandescent bulb or other light-emitting device or component. Lighting device 100 may be electrically connected to a power or energy modulating circuit or controller 115 for converting electrical energy and driving the at least one lighting element 110. In some embodiments, power or energy modulating circuit or controller 115 may comprise a pulse frequency modulating (PFM) circuit or controller, or any circuit or device that converts, for example, a first direct current (DC) voltage to a second direct current (DC) voltage. Other forms of energy conversion may also be achieved.

Towards the right (or proximate) side of the body 105, lighting device 100 may also include at least one peltier tile 120 that is disposed along the outer wall of body 105. In some embodiments, the at least one peltier tile 120 may be positioned within an opening of in body 105 and thereby form part of the of body 105. The at least one politer tile may also be electrically connected to the power or energy modulating circuit or controller 115 through wires 130. In some embodiments, there may be a plurality of peltier tiles that are connected in a serial manner, such as through soldering, for example.

Each of the at least one peltier tile 120 may have a first surface (top surface as shown) for coming into direct or indirect contact with a human hand to initiate the thermoelectric effect. Each of the at least one peltier tile may also include a second surface (bottom surface as shown) that, in some embodiments, may come into direct or indirect contact with a cooling component 125. The presence of the cooling component 125 enhances the thermoelectric effect by enlarging the temperature differential between the first and second surfaces of each of the at least one peltier tile 120 during handheld initiation of the lighting device. For example, hand holding the lighting device and coming into direct or indirect contact with the peltier tiles will present a first temperature on the first (top) surface that results in a temperature differential with the second (bottom) surface whose temperature will be influenced by the temperature of the cooling component 125. Cooling component 125 may comprise at least one gel pack or other like component or structure that serves to cool the second or bottom surface of the at least one peltier tile 120. During non-use, lighting device 100 may be refrigerated so as to "recharge" the cooling component through freezing or exposure to colder temperatures.

FIG. 2 is a cross-sectional side view of a lighting device 200, according to another embodiment of the present invention. Lighting device 200 may include a body 205, at least one lighting element 210, power or energy modulating circuit or controller 215, at least one peltier tile 220 (with wires 230), and cooling component 225 that operate in the same manner as described above in connection with lighting device 100 depicted in FIG. 1. Lighting element may further include an insulating component 235 that serves to insulate and reduce warming of the cooling component 225 during operation of the lighting device 200. In some embodiments, insulating component 235 may comprising a lining, such as, for example, aluminum foil or material having insulating properties. Insulating component may insulate only the cooling component or the entire inner wall of the body 105 (as shown in shaded form in FIG. 2). In some embodiments, the upward wall of body 105 shown on the right (or proximate end) of the body is removed to allow air circulation along the inner wall of the body and the at least one cooling component.

Other embodiments, uses and advantages of the present invention will be apparent to those skilled in the art from consideration of the specification and practice of the invention disclosed herein. The specification and examples should be considered exemplary only. The intended scope of the invention is only limited by the claims appended hereto.

What is claimed is:

1. A rechargeable handheld lighting device, comprising:
   a cylindrical body forming an inner wall and an outer wall, and further having a distal end and a proximate end;
   at least one peltier tile disposed along the outer wall and towards the proximate end of the cylindrical body, each of the at least one peltier tile having a first side for coming into contact with a user's hand and a second side which forms part of the inner wall of the cylindrical body;
   at least one lighting element disposed at least partially within and towards the distal end of the cylindrical body;
   a conversion component electrically connected to the at least one lighting element and the at least one peltier tile; and
   at least one rechargeable gel pack disposed within the cylindrical body and directly contacting the second side of the at least one peltier tile, wherein the at least one rechargeable gel pack enlarges the temperature differential between the first and second surfaces of each of the at least one peltier tile during handheld initiation; and
   an insulating aluminum foil lining disposed along the entire inner wall of the cylindrical body to insulate and reduce warming of the at least one rechargeable gel pack during operation.

2. The lighting device of claim 1 wherein the at least one peltier tile forms a serial circuit.

3. The lighting device of claim 1 wherein the power conversion component comprises a pulse frequency modulating (PFM) chip or board.

4. The lighting device of claim 1 wherein the cylindrical body is comprised of polyethylene terephthalate (PET), polyvinyl chloride (PVC), polyurethane, or other plastic material.

5. The lighting device of claim 1 wherein the at least one lighting element comprises at least one light-emitting diode (LED).

6. The lighting device of claim 1 wherein the proximate end of the cylindrical body is open to allow air circulation along the inner wall of the cylindrical body and the at least one cooling component.

7. A rechargeable handheld lighting device, comprising:
   a cylindrical body forming an inner wall and an outer wall, and further having a distal end and a proximate end;
   a plurality of peltier tiles electrically connected in serial and disposed along the outer wall and towards the proximate end of the cylindrical body, each of the plurality of peltier tiles having a first side for coming into contact with a user's hand and a second side which forms part of the inner wall of the cylindrical body;
   at least one lighting element disposed at least partially within and towards the distal end of the cylindrical body;
   an energy conversion component electrically connected to the at least one lighting element and the plurality of peltier tiles;
   at least one rechargeable gel pack disposed within the cylindrical body and directly contacting and cooling the second side of the plurality of peltier tiles, wherein the rechargeable gel pack enlarges the temperature differential between the first and second surfaces of each of the plurality of peltier tiles during handheld initiation; and
   an insulating aluminum foil lining disposed along the entire inner wall of the cylindrical body to insulate and reduce warming of the at least one cooling component during operation.

\* \* \* \* \*